(12) United States Patent
Doyle

(10) Patent No.: US 9,662,675 B2
(45) Date of Patent: May 30, 2017

(54) EXTERNAL INVERTER SYSTEM FOR VARIABLE SUBSTRATE THICKNESS AND METHOD FOR ROTATING A SUBSTRATE

(71) Applicant: Illinois Tool Works Inc., Glenview, IL (US)

(72) Inventor: Dennis G. Doyle, Shrewsbury, MA (US)

(73) Assignee: Illinois Tool Works Inc., Glenview, IL (US)

( * ) Notice: Subject to any disclaimer, the term of this patent is extended or adjusted under 35 U.S.C. 154(b) by 372 days.

(21) Appl. No.: 14/448,834

(22) Filed: Jul. 31, 2014

(65) Prior Publication Data
US 2016/0030971 A1 Feb. 4, 2016

(51) Int. Cl.
*B05C 13/00* (2006.01)
*B05C 9/02* (2006.01)
*B05D 1/00* (2006.01)
*H05K 13/00* (2006.01)
*H05K 13/04* (2006.01)

(52) U.S. Cl.
CPC .............. *B05C 13/00* (2013.01); *B05C 9/02* (2013.01); *B05D 1/00* (2013.01); *H05K 13/0061* (2013.01); *H05K 13/0469* (2013.01)

(58) Field of Classification Search
None
See application file for complete search history.

(56) References Cited

U.S. PATENT DOCUMENTS

| 4,565,400 A | | 1/1986 | Nakashima et al. |
| 4,798,278 A | * | 1/1989 | Cornacchia .......... B65G 47/252 |
| | | | 198/399 |
| 4,871,584 A | | 10/1989 | Weber |
| 4,969,552 A | * | 11/1990 | Kennicutt .......... H05K 13/0061 |
| | | | 198/399 |
| 5,044,900 A | | 9/1991 | Cavallaro |

(Continued)

FOREIGN PATENT DOCUMENTS

| DE | 4107224 C1 | 6/1992 |
| DE | 10 2005 045 161 A1 | 4/2007 |

(Continued)

OTHER PUBLICATIONS

Notification of Transmittal of the International Search Report and the Written Opinion of the International Searching Authority from corresponding PCT/US2015/028943 mailed Oct. 12, 2015.

*Primary Examiner* — Jill Culler
(74) *Attorney, Agent, or Firm* — Lando & Anastasi, LLP

(57) ABSTRACT

A dispenser includes a frame, a gantry system, a dispensing unit, a substrate support assembly, a transport system, and an inverter system coupled to the frame and in communication with the transport system. The inverter system is positioned outside the substrate support assembly and configured to rotate a substrate orientation between a first position in which a top surface of the substrate is in a dispense position and a second position in which a bottom surface of the substrate is in a dispense position. The inverter system includes a first driven assembly configured to engage one edge of the substrate and a second driven assembly configured to engage an opposite edge of the substrate. The first driven assembly and the second driven assembly are configured to drive a linear movement of the substrate.

16 Claims, 6 Drawing Sheets

(56) References Cited

U.S. PATENT DOCUMENTS

| | | |
|---|---|---|
| 5,474,641 A | 12/1995 | Otsuki et al. |
| 5,795,390 A | 8/1998 | Cavallaro |
| 5,819,983 A | 10/1998 | White et al. |
| 5,837,892 A | 11/1998 | Cavallaro et al. |
| 5,886,494 A | 3/1999 | Prentice et al. |
| 5,903,125 A | 5/1999 | Prentice et al. |
| 5,918,648 A | 7/1999 | Carr et al. |
| 5,957,343 A | 9/1999 | Cavallaro |
| 5,971,227 A | 10/1999 | White et al. |
| 5,985,029 A | 11/1999 | Purcell |
| 6,007,631 A | 12/1999 | Prentice et al. |
| 6,017,392 A | 1/2000 | Cavallaro |
| 6,025,689 A | 2/2000 | Prentice et al. |
| 6,056,190 A | 5/2000 | Foulke et al. |
| 6,073,748 A | 6/2000 | Douglas |
| 6,082,289 A | 7/2000 | Cavallaro |
| 6,085,943 A | 7/2000 | Cavallaro et al. |
| 6,093,251 A | 7/2000 | Carr et al. |
| 6,112,588 A | 9/2000 | Cavallaro et al. |
| 6,119,895 A | 9/2000 | Fugere et al. |
| 6,157,157 A | 12/2000 | Prentice et al. |
| 6,170,737 B1 | 1/2001 | Foulke et al. |
| 6,206,964 B1 | 3/2001 | Purcell et al. |
| 6,214,117 B1 | 4/2001 | Prentice et al. |
| 6,216,917 B1 | 4/2001 | Crouch |
| 6,224,671 B1 | 5/2001 | Cavallaro |
| 6,224,675 B1 | 5/2001 | Prentice et al. |
| 6,258,165 B1 | 7/2001 | Cavallaro |
| 6,322,854 B1 | 11/2001 | Purcell et al. |
| 6,371,339 B1 | 4/2002 | White et al. |
| 6,378,737 B1 | 4/2002 | Cavallaro et al. |
| 6,391,378 B1 | 5/2002 | Carr et al. |
| 6,395,334 B1 | 5/2002 | Prentice et al. |
| 6,412,328 B1 | 7/2002 | Cavallaro et al. |
| 6,427,903 B1 | 8/2002 | Foulke et al. |
| 6,444,035 B1 | 9/2002 | Nowak et al. |
| 6,514,569 B1 | 2/2003 | Crouch |
| 6,540,832 B2 | 4/2003 | Cavallaro |
| 6,541,063 B1 | 4/2003 | Prentice et al. |
| 6,641,030 B1 | 11/2003 | Freeman et al. |
| 6,644,238 B2 | 11/2003 | Watts et al. |
| 6,688,458 B2 | 2/2004 | Prentice et al. |
| 6,739,483 B2 | 5/2004 | White et al. |
| 6,775,879 B2 | 8/2004 | Bibeault et al. |
| 6,814,810 B2 | 11/2004 | Prentice et al. |
| 6,866,881 B2 | 3/2005 | Prentice et al. |
| 6,902,052 B2 | 6/2005 | Prentice et al. |
| 6,932,280 B2 | 8/2005 | Crouch |
| 7,404,861 B2 | 7/2008 | Prentice et al. |
| 7,833,572 B2 | 11/2010 | Read |
| 7,923,056 B2 | 4/2011 | Read |
| 7,980,197 B2 | 7/2011 | Prentice et al. |
| 8,136,705 B2 | 3/2012 | Tracy et al. |
| 8,181,767 B2 * | 5/2012 | Gales .................. A21C 9/08 198/404 |
| 8,230,805 B2 | 7/2012 | Read |
| 8,424,720 B2 | 4/2013 | Tracy et al. |
| 9,357,686 B2 * | 5/2016 | Doyle ............. H05K 13/0469 |
| 2003/0209560 A1 | 11/2003 | Hui et al. |
| 2004/0037690 A1 | 2/2004 | Kubo et al. |
| 2004/0129534 A1 | 7/2004 | Prentice et al. |
| 2006/0016462 A1 | 1/2006 | Asano |
| 2006/0193969 A1 | 8/2006 | Prentice et al. |
| 2007/0281100 A1 | 12/2007 | Herre et al. |
| 2008/0159617 A1 | 7/2008 | Yang et al. |
| 2008/0176003 A1 | 7/2008 | Tsutsumi et al. |
| 2008/0296311 A1 | 12/2008 | Read |
| 2012/0240658 A1 | 9/2012 | Tracy |
| 2012/0288635 A1 | 11/2012 | Tanabe et al. |
| 2013/0133574 A1 | 5/2013 | Doyle et al. |
| 2013/0136850 A1 | 5/2013 | Doyle et al. |
| 2013/0177702 A1 | 7/2013 | Crouch et al. |
| 2013/0247370 A1 | 9/2013 | Kawase et al. |

FOREIGN PATENT DOCUMENTS

| | | |
|---|---|---|
| DE | 112011104331 T5 | 10/2013 |
| EP | 1 937 045 A1 | 6/2008 |
| KR | 20100079524 A | 7/2010 |
| WO | 93/16812 A1 | 9/1993 |
| WO | 00/65316 A1 | 11/2000 |
| WO | 2008/020974 A2 | 2/2008 |

* cited by examiner

EXTERNAL INVERTER SYSTEM FOR VARIABLE SUBSTRATE THICKNESS AND METHOD FOR ROTATING A SUBSTRATE

BACKGROUND OF THE DISCLOSURE

1. Field of the Invention

The invention relates generally to methods and apparatus for dispensing a viscous material on a substrate, such as a printed circuit substrate, and more particularly to a dispenser that is capable of dispensing viscous material on both sides of the substrate.

2. Discussion of Related Art

There are several types of prior art dispensing systems or dispensers used for dispensing metered amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which mechanically secure components to the circuit board. Underfill materials and encapsulents are used to improve the mechanical and environmental characteristics of the assembly. Such automated dispensing systems are typically capable of dispensing on one side of the circuit board only.

FIG. 1 schematically illustrates a known dispenser, which is generally indicated at 10. The dispenser 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications. It should be understood that references to viscous or semi-viscous materials, as used herein, are exemplary and intended to be non-limiting. In one embodiment, the dispenser 10 includes first and second dispensing units or heads, generally indicated at 14 and 16, respectively, and a controller 18 to control the operation of the dispenser. Although two dispensing units are shown, it should be understood that one or more dispensing units may be provided.

The dispenser 10 may also include a frame 20 having a base or support 22 for supporting the substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispenser 10 to control loading and unloading of substrates to and from the dispenser. The gantry 24 can be moved using motors under the control of the controller 18 to position the dispensing units 14, 16 at predetermined locations over the substrate. The dispenser 10 may include a display unit 28 connected to the controller 18 for displaying various information to an operator. There may be an optional second controller for controlling the dispensing units.

Prior to performing a dispensing operation, as described above, the substrate, e.g., the printed circuit board, must be aligned or otherwise in registration with a dispensing unit of the dispenser. The dispenser further includes a vision system 30, which is coupled to a vision system gantry 32 movably coupled to the frame 20 for supporting and moving the vision system. Although shown separately from the dispensing unit gantry 24, the vision system gantry 32 may utilize the same gantry system as the dispensing units 14, 16. As described, the vision system 30 is employed to verify the location of landmarks, known as fiducials or other features and components, on the substrate. Once located, the controller can be programmed to manipulate the movement of one or both of the dispensing units 14, 16 to dispense material on the electronic substrate. The dispense operation may be controlled by the controller 18, which may include a computer system configured to control material dispensers. In another embodiment, the controller 18 may be manipulated by an operator.

In some embodiments, the dispenser 10 may operate as follows. The circuit board may be loaded into the dispenser 10 in a depositing position using the conveyor system. The circuit board is aligned with the dispensing units 14, 16 by using the vision system 30. The dispensing units 14, 16 may then be initiated by the controller 18 to perform a deposit operation in which material is deposited at precise locations on the circuit board. Once the dispensing units 14, 16 have performed a depositing operation, the circuit board may be transported by the conveyor system from the dispenser 10 so that a second, subsequent circuit board may be loaded into the material deposition system. The dispensing units 14, 16 may be constructed to be quickly removed and replaced with other units. The dispenser 10 is capable of dispensing material on only one side of the circuit board.

Sometimes, it is desirable to dispense such materials on both sides of the circuit board. One such dispenser is offered by Protec Co., Ltd of Incheon, Korea, and incorporates a substrate support that rotates about an axis that is transverse to a direction that the substrate travels through the dispenser. With this dispenser, belts that engage edges of the substrate move the substrate through the dispenser. With this arrangement, it is difficult to dispense material near edges of the substrate since the belts interfere with the dispensing unit when attempting to dispense material near the edges of the substrate.

Examples of other dispensers capable of inverting the substrate for depositing material on both sides of the substrate are disclosed in U.S. patent application Ser. No. 14/080,169 entitled DISPENSING APPARATUS HAVING SUBSTRATE INVERTER SYSTEM AND CLAMPING SYSTEM, AND METHOD FOR DISPENSING A VISCOUS MATERIAL ON A SUBSTRATE by Dennis G. Doyle and Thomas E. Robinson filed on Nov. 14, 2013, in U.S. patent application Ser. No. 14/080,345 entitled DISPENSING APPARATUS HAVING SUBSTRATE INVERTER SYSTEM AND ROLLER SYSTEM, AND METHOD FOR DISPENSING A VISCOUS MATERIAL ON A SUBSTRATE by Dennis G. Doyle filed on Nov. 14, 2013, and in U.S. patent application Ser. No. 14/080,174 entitled DISPENSING APPARATUS HAVING TRANSPORT SYSTEM AND METHOD FOR TRANSPORTING A SUBSTRATE WITHIN THE DISPENSING APPARATUS by Dennis G. Doyle and Thomas E. Robinson filed on Nov. 14, 2013. All of these patent applications are owned by the assignee of the present disclosure and incorporated herein by reference for all purposes.

SUMMARY OF THE DISCLOSURE

One aspect of the disclosure is directed to a dispenser for dispensing viscous material on a substrate having a top surface and a bottom surface. In one embodiment, the dispenser comprises a frame, a gantry system coupled to the frame, and a dispensing unit coupled to the gantry system. The gantry system is configured to move the dispensing unit in x-axis, y-axis, and z-axis directions. The dispenser further comprises a substrate support assembly coupled to the frame and configured to support the substrate in a dispense position to dispense material on the top surface of the substrate and on the bottom surface of the substrate, and a transport system coupled to the frame and configured to transport substrates into and out of the substrate support assembly. The dispenser further comprises an inverter system coupled to the frame and in communication with the transport system. The inverter system is positioned outside the substrate support assembly and configured to rotate a substrate orientation between a first position in which the top surface of the substrate faces upwardly and a second position in which the bottom surface of the substrate faces upwardly. The inverter system includes a first driven assembly configured to engage one edge of the substrate and a second driven assembly configured to engage an opposite edge of the substrate. The first driven assembly and the second driven assembly are configured to drive a linear movement of the substrate.

Embodiments of the dispenser further may include the first driven assembly of the inverter system having a first roller assembly and the second driven assembly of the inverter system includes a second roller assembly configured to engage an opposite edge of the substrate. Each of the first roller assembly and the second roller assembly may include a support structure, a plurality of rollers coupled to the support structure and configured to engage one of a top edge of the substrate and a bottom edge of the substrate, and a roller drive assembly coupled to the support structure and configured to drive the rotation of the rollers. Each of the first roller assembly and the second roller assembly may include a pivot assembly that is connected to the support structure of the roller assembly. The rollers of each of the first roller assembly and the second roller assembly may include a plurality of gears, each gear being associated with a respective roller. Each of the first roller assembly and the second roller assembly further may include a belt drive assembly coupled to the support structure and configured to engage the other of the top edge of the substrate and the bottom edge of the substrate. Each of the first roller assembly and the second roller assembly may include a pivot assembly that is connected to the support structure of the roller assembly. The pivot assembly may include a pivot secured to the support structure and a rotational drive assembly to rotate the pivot, which rotates the support structure and the rollers. The rotational drive assembly may include a belt coupled to the pivot, and a motor configured to drive the belt to rotate the pivot. The rollers of each of the first roller assembly and the second roller assembly may include a plurality of gears, each gear being associated with a respective roller. The roller drive assembly of each of the first roller assembly and the second roller assembly may be coupled to a drive gear of one of the plurality of gears. The roller drive assembly may include a belt coupled to the drive gear, and a motor configured to drive the belt to rotate the drive gear. The support structure may include a first support member associated with the plurality of rollers and a second support member associated with the belt drive assembly, with the first support member being configured to move upwardly and downwardly relative to the second support member. Each of the first roller assembly and the second roller assembly further may include a cam mechanism configured to move the first support member with respect to the second support member. The frame may include a shelf disposed on an outlet side of the transport system, with the shelf being configured to support the inverter system. The substrate support assembly may include two lanes, a front lane and a rear lane, with the transport system being configured to deliver substrates to the front lane and the rear lane of the dispenser. The inverter system may be configured to move between the front lane and the rear lane along rails.

Another aspect of the disclosure is directed to a method of depositing material on a top surface of a substrate and on a bottom surface of the substrate. In one embodiment, the method comprises: delivering the substrate to a substrate support assembly of a dispenser through a first lane; performing a dispense operation on the top surface of the substrate; moving the substrate to an inverter system associated with the dispenser; rotating the substrate so that the bottom surface of the substrate faces upwardly; moving the substrate back to the substrate support assembly; performing a dispense operation on the bottom surface of the substrate; removing the substrate from the substrate support assembly of the dispenser; and delivering another substrate to the substrate support assembly of the dispenser through a second lane.

Embodiments of the method further may include moving an inverter system configured to rotate the substrate between the first lane and the second lane to rotate the substrates for reinsertion in either lane. The method further may include clamping the substrate with a roller assembly prior to rotating the substrate.

BRIEF DESCRIPTION OF THE DRAWINGS

For a better understanding of the disclosure, reference is made to the figures which are incorporated herein by reference and in which.

DETAILED DESCRIPTION OF THE PREFERRED EMBODIMENTS

Figure 1:
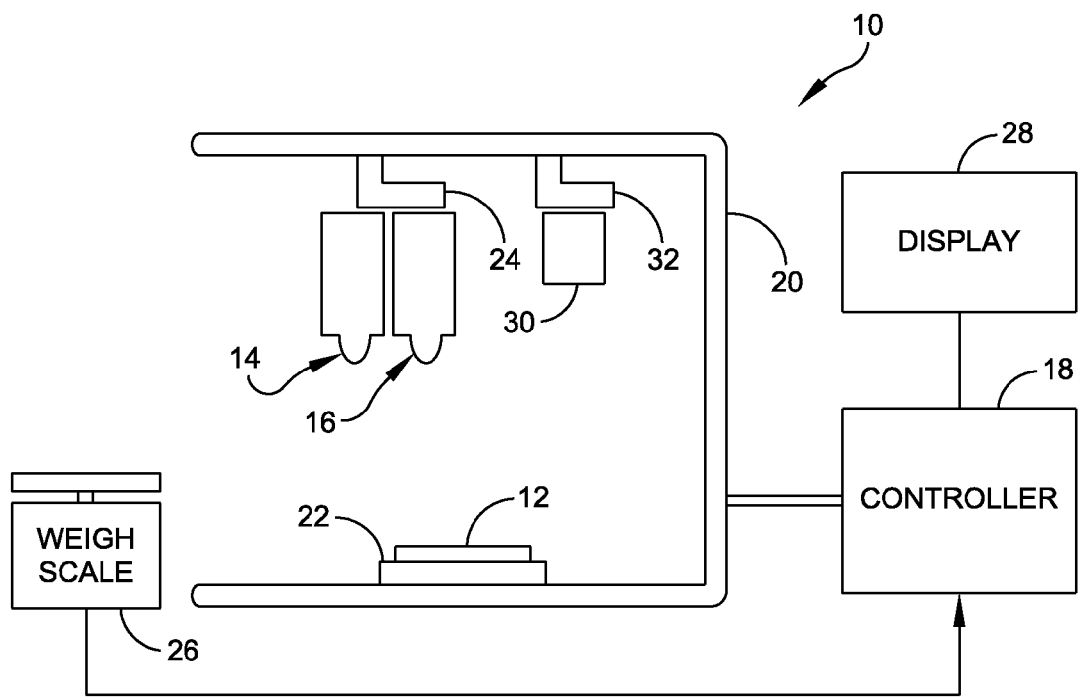
FIG. 1 is a schematic view of a prior art dispenser.

For the purposes of illustration only, and not to limit the generality, the disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the present disclosure are described below, with reference to a dispenser used to dispense solder paste onto a circuit board. The apparatus and associated methods may also be used in other applications requiring dispensing of other viscous or dispensing materials, such as glues, adhesives, and encapsulants on a variety of substrates. For example, the apparatus may be used to dispense epoxy for use as underfill for chip-scale packages. In certain embodiments, the dispensing units may be of the type offered by Speedline Technologies, Inc. of Franklin, Mass.

The present disclosure is directed to an inverter system for inverting a substrate for depositing material on both sides of substrate. Specifically, the inverter system is associated with a dispenser and resides outside the dispense zone. In one example, when a top side of the substrate is completed (i.e., dispensed upon by the dispenser), the substrate exits the dispenser to the inverter system, which inverts the substrate and delivers the substrate back into the dispenser for dispensing on a bottom side of the substrate. The inverter system of the present disclosure is capable of inverting substrates having a wide range of substrate thicknesses. In a certain embodiment, the inverter system is capable of inverting substrates having thicknesses ranging from 0.5 mm to 5 mm thick, with a 3 mm component edge clearance for both top and bottom side. No manual or automated adjustments are allowed for this range of substrate. An object of the inverter system is to enable the dispenser to accommodate a variety of customer applications, without having to be specifically designed for a particular substrate thickness.

With the prior art inverter, which is embedded within the dispenser, the substrate is secured by two o-ring belts, or one flat belt and some o-ring idler pulleys. This inverter is capable of accommodating a limited range of thicknesses since a minimum pinching force must be achieved to maintain belt traction to drive the substrate.

The inverter system of embodiments of the present disclosure utilizes a belt/roller clamp configuration that is capable of accommodating a wide range of substrate thicknesses. In an open state, a clamp gap of the inverter system between a belt drive train and a roller drive train is 5 mm. A center point of a pivot of the inverter system is 2.5 mm above a belt, which is centered in the clamp. Both the belt and the rollers are driven by the same motor and therefore operate in synchronization.

A substrate is driven into the inverter system using a standard belt drive. Once inside the inverter system, an air cylinder is activated, which uses cams to lower the rollers against the substrate to clamp the substrate to the belt to enable the belt to hold the substrate from slipping during the 180 degree rotation. After the inverter system rotates, the air cylinder is deactivated lowering both the roller drive train and the substrate down to a transport height for delivery back to the dispenser. The rollers then drive the substrate back into the dispenser for dispensing on the bottom side. The inverter system then rotates 180 degrees back to its original orientation and waits for the board to exit the machine and then for the process to repeat itself.

This present disclosure is directed to a dispenser including a substrate support assembly having an inverter system provided outside the dispense zone, the inverter system being designed to engage the substrate without interfering with a dispensing unit when dispensing material near edges of the substrate. The dispenser disclosed herein is capable of inverting the substrate, thereby enabling the dispensing unit to dispense material on both sides of the substrate.

Figure 2:
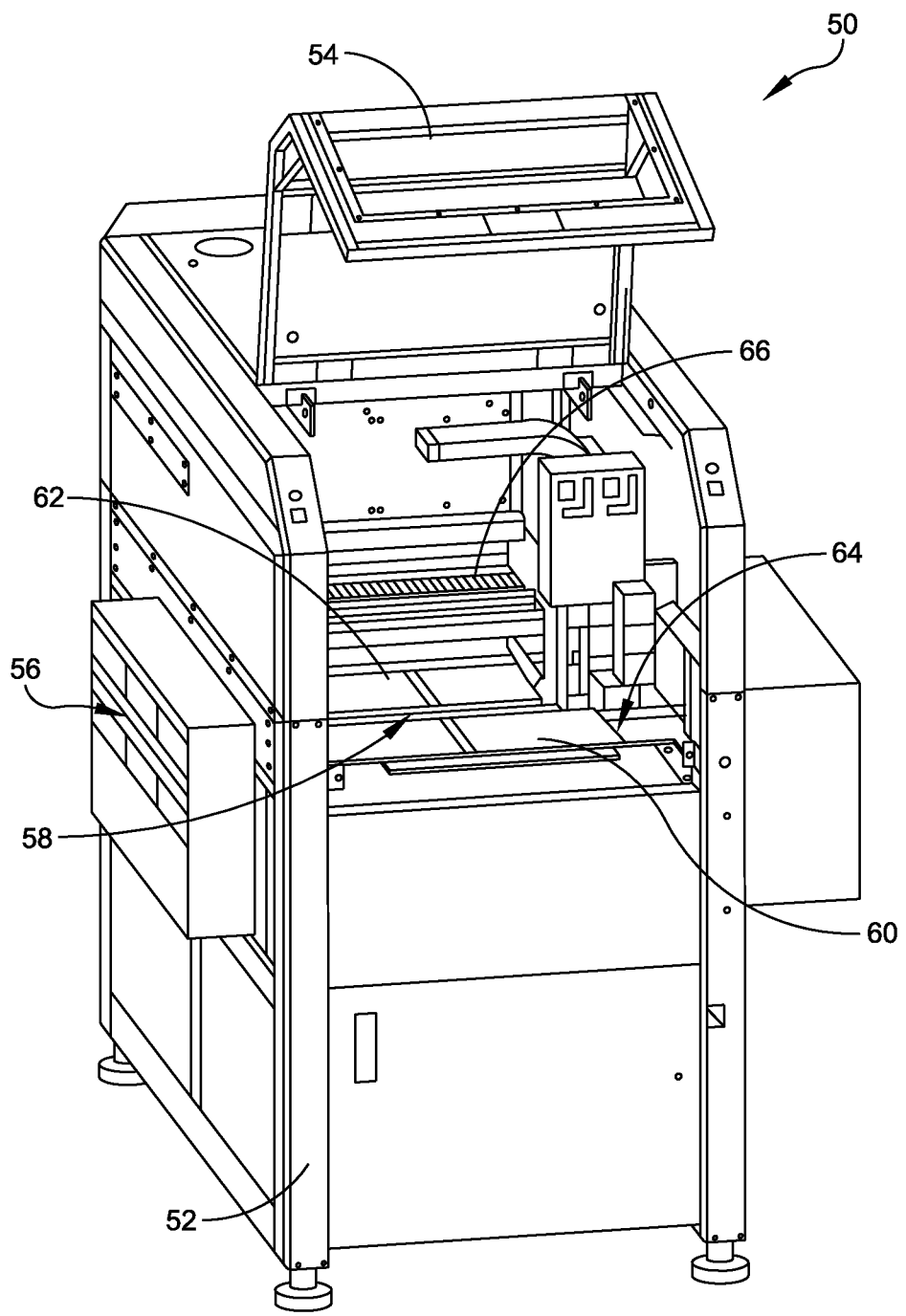
FIG. 2 is a perspective view of a dispenser of an embodiment of the present disclosure with a cover of the dispenser in an open position to reveal an interior of the dispenser.
Figure 3:
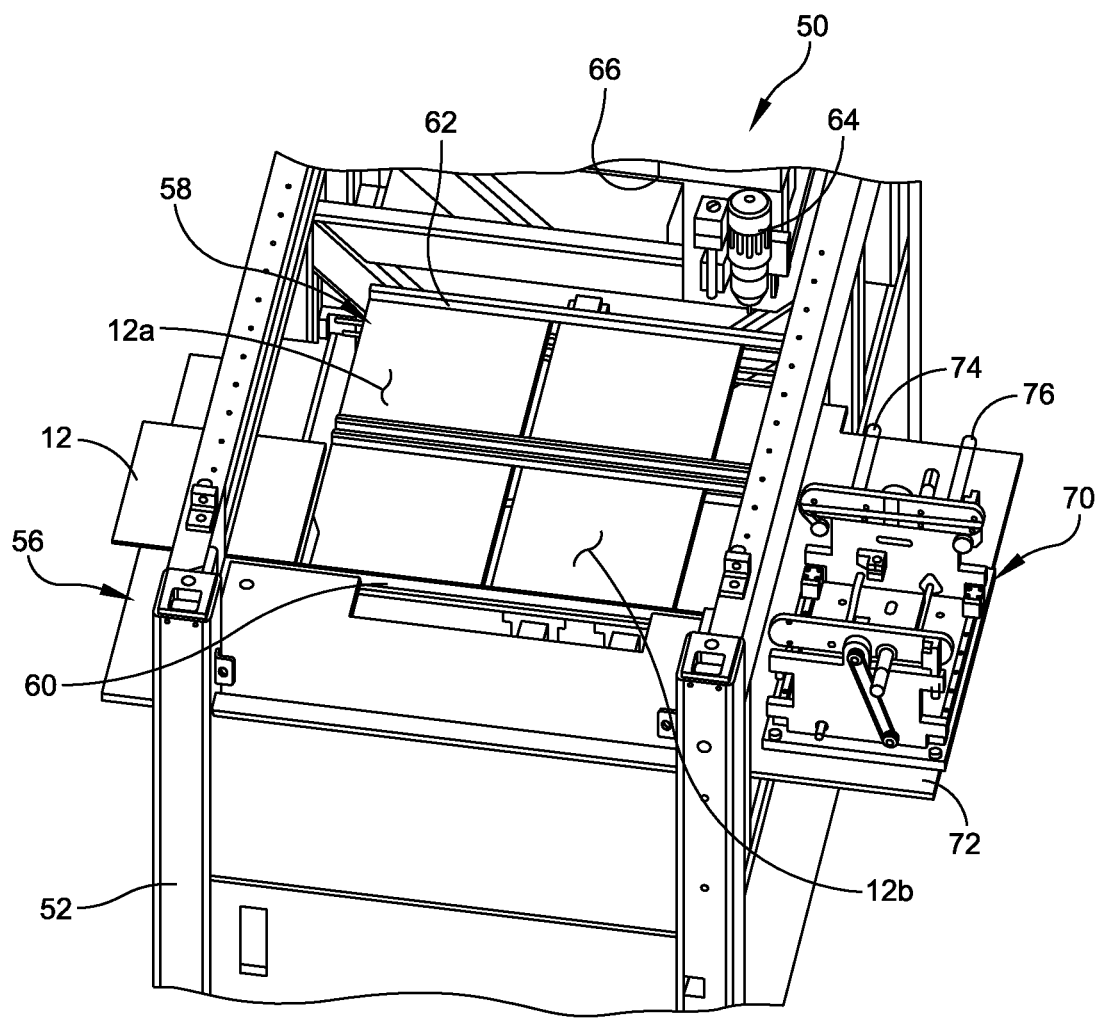
FIG. 3 is an enlarged top perspective view of the dispenser having an external inverter system of an embodiment of the present disclosure.

Referring to the drawings, and more particularly to FIGS. 2 and 3, a dispenser, generally indicated at 50, of an embodiment of the present disclosure is configured to dispense material on both sides of a substrate. Substrates are indicated at 12 throughout the drawings, with a top surface of the substrate being designated at 12a and a bottom surface of the substrate being designated at 12b. As with dispenser 10, the dispenser 50 of embodiments of the present disclosure is used to dispense viscous material (e.g., an adhesive, encapsulent, epoxy, solder paste, underfill material, etc.) or a semi-viscous material (e.g., soldering flux, etc.) onto the electronic substrate. The electronic substrate 12 can embody a printed circuit board, semiconductor wafer, or other type of substrate on which viscous materials may be dispensed.

As shown, the dispenser 50 includes a frame 52, which supports the systems and components of the dispenser. The frame 52 includes an access door 54, which is shown in an open position in FIG. 2, to access an interior of the dispenser 50. The dispenser 50 further includes a transport system, generally indicated at 56, which shuttles substrates 12 into and out of the dispenser. In one embodiment, the transport system 56 includes roller assemblies supported by the frame as is known in the art, the roller assemblies being positioned to deliver substrates into and out of the dispenser 50. Specifically, the roller assemblies of the transport system 56 are designed to engage edges of the substrate 12 and drive the movement of the substrate through the dispenser.

Referring additionally to FIG. 3, the dispenser 50 further includes a substrate support assembly, generally indicated at 58, which is configured to support the substrate 12 during a dispense operation. As shown, the substrate support assembly 58 operates with and in some embodiments is part of the transport system 56 to support substrates 12 that are delivered to and from the substrate support assembly in one of two lanes 60, 62 provided in the dispenser 50. The substrate support assembly 58 is configured to align and support the substrate 12 prior to and during a dispense operation. Once the dispense operation occurs, the transport assembly 56 removes the substrate 12 from the substrate support assembly 58 so that another substrate can be delivered to the substrate support assembly.

The dispenser 50 further includes at least one dispensing unit 64 that is connected to the frame 52 by a gantry system 66. It should be understood that more than one dispensing unit 64 may be provided. The dispenser 50 further includes a controller, such as the controller 18, to control the operation of the dispenser. The dispenser 50 also may include a vision system, such as vision system 30, for aligning and inspecting the substrates 12, with the vision system operating with the controller to properly align and inspect the substrate. The dispenser further may include a weigh scale, such as weigh scale 26, for weighing dispensed quantities of the viscous material, for example, as part of a calibration procedure, and providing weight data to the controller.

In one embodiment, the gantry system 66 can be moved using motors under the control of the controller to position the dispensing unit 64 at predetermined locations over the substrate 12. In one embodiment, the substrate 12 is loaded into the dispenser 50 on the substrate support assembly 58 by the transport system 56. The substrate 12 is aligned with the dispensing unit 64 by using the vision system. The dispensing unit 64 is then be initiated by the controller to perform a deposit operation in which material is deposited at precise locations on the substrate 12. Once the dispensing unit 64 performs the dispensing deposition operation, the substrate 12 is transported by the transport system 56 from the dispenser 50 so that a second, subsequent substrate 12 is loaded into the dispenser, either on the same front lane 60 or on the rear lane 62. As will be discussed below, the dispenser 50 of embodiments of the present disclosure is capable of dispensing material on both sides of the substrate 12.

The dispenser 50 described thus far is similar to prior known dispensing systems. One difference is that the dispenser 50 includes two lanes 60, 62 through which the transport system 56 delivers substrates 12 through the dispenser for initiating dispensing operations. As shown in FIG. 3, the front lane 60 is positioned adjacent to a front of the dispenser 50 and the rear lane 62 is positioned adjacent to a rear of the dispenser. The provision of two lanes increases the throughput of substrates 12 through the dispenser 50. The transport system 56 is designed to transport substrates through both the front lane 60 and the rear lane 62. The arrangement is such that each system includes subassemblies that interact with subassemblies of other systems and other components of the dispenser 50 to move substrates 12 into and out of the dispenser and to dispense material on the substrates. The controller associated with the dispenser 50 is configured to control the operation of the systems of the dispenser. In one embodiment, the controller is similar to and provides the functionality of controller 18 of dispenser 10.

As shown in FIG. 3, the dispenser further includes an inverter system, generally indicated at 70, that is coupled to the frame 52 and in communication with the transport system 56. In one embodiment, the inverter system 70 is positioned outside the substrate support assembly 58 and configured to rotate the substrate 12 orientation between a first position in which the top surface 12*a* of the substrate faces upwardly and a second position in which the bottom surface 12*b* of the substrate faces upwardly. In a certain embodiment, the frame 52 includes a shelf 72 disposed on an outlet side of the transport system 56. The shelf 72 is constructed to support and provide operational control and power to the inverter system 70 via the controller.

The inverter system 70 is configured to move between the front lane 60 and the rear lane 62 on the shelf 72 by a movement mechanism including a pair of rails 74, 76 that are coupled to the inverter system. The movement mechanism further may embody a ball screw drive to move the inverter system 70 on the rails 74, 76. The arrangement is such that the inverter system 70 travels between the front lane 60 and the rear lane 62 to invert substrates 12 that are delivered to both of these lanes when dispensing on both sides 12*a*, 12*b* of the substrates is required. Specifically, the inverter system 70 is capable of rotating the substrate so that the bottom surface 12*b* of the substrate 12 faces upwardly so that the dispensing unit 64 can dispense material on the bottom surface. In a certain embodiment, a maximum size of the substrate 12 is approximately ten inches by ten inches. Thus, for a substrate 12 having a length and width of ten inches by ten inches, a rotation path of the substrate would be ten inches wide and ten inches long.

Figure 4:
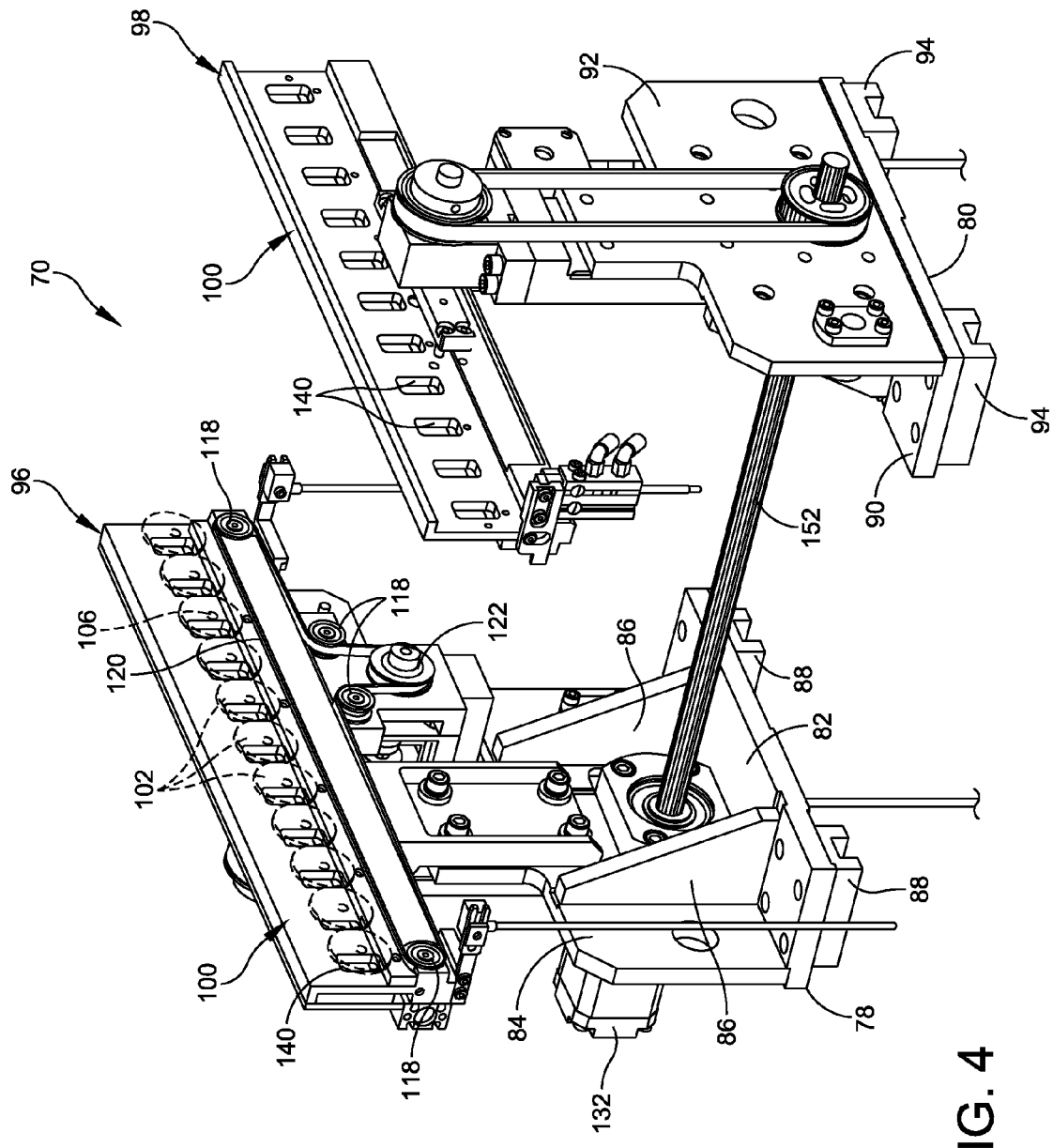
FIG. 4 is an enlarged perspective view of the external inverter system.

Referring to FIG. 4, the inverter system 70 includes a frame assembly that is designed to support the working components of the inverter system. The frame assembly includes a first support 78 provided on one side and a second, complementary support 80 provided on the other side. The first and second supports 78, 80 can be fabricated by any suitable materials, such as steel or an aluminum alloy, which are capable of supporting the components of the inverter system 70. Each of the first support 78 and the second support 80 can be substantially identical in construction.

In one embodiment, the first support includes a first base portion 82 and a first stanchion portion 84 extending upwardly from the first base portion. As shown, the first base portion 82 includes a pair of web portions, each indicated at 86, which provide structural support to the first support 78. The first base portion 82 of the first support 78 further includes a pair of guides, each indicated at 88, that guide the movement of the first support along the rails 74, 76 provided on the shelf 72. Similarly, the second support 80 includes a second base portion 90 and a second stanchion portion 92 extending upwardly from the second base portion. Although not shown, the second support 80 also includes web portions to provide structural support to the second support. The second base portion 90 of the second support 80 further includes a pair of guides, each indicated at 94, that guide the movement of the first support along the rails 74, 76.

The arrangement is such that the movement mechanism is configured to move the inverter system 70 back-and-forth along the rails 74, 76 between the front lane 60 and the rear lane 62 to invert substrates delivered to the inverter system on the front lane and the rear lane, respectively. In addition, the first support 78 and the second support 80 can be movable with respect to one another by a suitable drive assembly to accommodate substrates having varying widths. In a certain embodiment, the movement of the first support 78 and the second support 80 can be achieved by a pair of ball screw drive assemblies that extend between the first stanchion portion 84 and the second stanchion portion 92. The arrangement is that one motor mounts on the first stanchion 84 and a ball nut is mounted on the second support 80 to adjust for substrate width. The other ball screw is stationary on the shelf 72 by a mount. This ball screw engages a ball nut provided in the first base portion 82 and is used to move the entire assembly between the front and rear lanes.

The inverter system 70 further includes a first roller assembly, generally indicated at 96, supported by the first support 78 and configured to engage one edge of the substrate 12 and a second roller assembly, generally indicated at 98, supported by the second support 80 and configured to engage an opposite edge of the substrate. The roller assemblies 96, 98 are designed to grip respective edges of the substrate 12 during the inversion operation, while being capable of moving the substrate back to the dispense position on the substrate support assembly 56 with assistance from the transport system 58. As shown in FIG. 3, the first and second roller assemblies 96, 98 are positioned at a height coplanar with a height of the transport system 58. Thus, the shelf 72 is positioned below the height of the transport system 58. The roller assemblies 96, 98 are further designed to accommodate substrates 12 having varying thicknesses, up to 5 mm thick. As will be described below, the roller assemblies 96, 98 are synchronized with one another to rotate the substrate 12 at the same time and speed.

Figure 5:
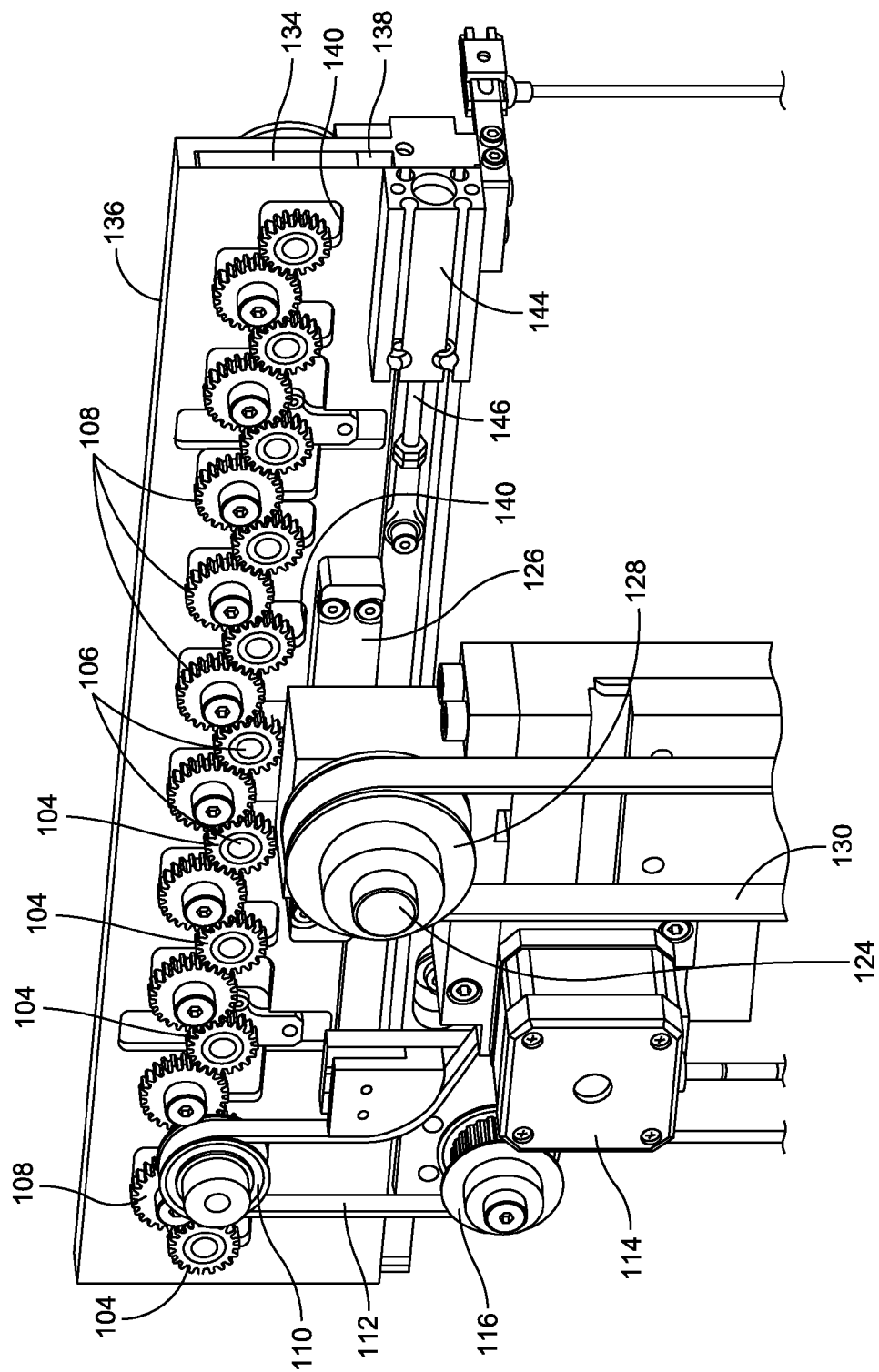
FIG. 5 is an enlarged perspective view of a portion of the external inverter system.

With additional reference to FIG. 5, each of the first roller assembly 96 and the second roller assembly 98 are identically constructed. For ease of description, the component parts and the assembly of the first roller assembly 96 will be described in detail with it being understood that the second roller assembly 98 is substantially identical. In one embodiment, the first roller assembly 96 includes an elongate support structure, generally indicated at 100, which is pivotally connected to the stanchion portion 84 of the first support 78. The first roller assembly further includes a plurality of rollers (e.g., eleven), each indicated at 102, which are coupled to the support structure 100 on an inner side and along a length of the support structure. The rollers 102 are configured to engage a top edge of the substrate 12. The rollers 102 are driven by a drive assembly coupled to the support structure 100 to move the substrate 12 into and out of the inverter system 70.

In a certain embodiment, the first roller assembly 96 further includes a plurality of gears, each indicated at 104, with each gear being associated with a respective roller 102. As shown, each roller 102 and gear 104 is secured to opposite ends of a shaft 106 so that the roller rotates when the gear is rotated. The shaft 106 is suitable secured to the support structure 100 by a bearing. Idler gears, each indicated at 108, are provided between and mesh with respective gears 104. The rollers 102 are driven by the gears 104 by a roller drive assembly. Specifically, one of the gears 104 is provided as a drive gear and has a pulley 110 mounted on an outer end of the shaft 106. The roller drive assembly includes a belt 112 coupled to the pulley 110 of the drive gear 104, and a motor 114 configured to drive the belt to rotate the drive gear. The motor 114 is operated under the control of the controller. In certain embodiments, the inverter system 70 may have a processor or controller embedded therein, which operates with the controller. As shown, the roller drive assembly further includes an idler up pulley 116 to adjust a tension of the belt 112. The roller drive assemblies of the first roller assembly 96 and the second roller assembly 98 are synchronized with one another to drive the movement of the substrate into and out of the inverter system 70. The motors are wired together to the same controller and run in opposite directions so the belts and the rollers act together to move the substrate at the same speed using both edges of the substrate and driving with both the belt and the rollers simultaneously.

The first roller assembly 96 further includes a belt drive assembly coupled to the support structure 100 on an inner side and along a length of the support structure. In one embodiment, the belt drive assembly is positioned below the rollers 102 and their respective gears 104 on the support structure 100, and includes four pulleys, each indicated at 118, and a belt 120 provided on the pulleys. A drive pulley 122 is provided to drive the rotation of the belt 120 when operating the first roller assembly 96. The arrangement is such that upon activation of the motor 114, the pulley 110 is driven by the belt 112, and the drive pulley 122 is driven to rotate the belt 120 at the same or nearly the same speed as the rotation of the rollers 102. As with the other components of the inverter system 70, the operation of the first roller assembly 96 is controlled by the controller or by a processor or controller associated with the inverter system.

In one embodiment, the first roller assembly 96 further includes a pivot assembly that is pivotally secured to the support structure 100 of the first roller assembly. The pivot assembly is designed to control the rotation of the substrate 12 by the inverter system 70 when performing an inversion process. The pivot assembly includes a pivot member 124, which is rotatably secured to the first stanchion portion 84 of the first support 78 by a suitable bearing. The pivot member 124 has one end connected to the support structure 100 by a bracket 126. The pivot assembly further includes a rotational drive assembly connected to a pulley 128 provided on the other end of the pivot member 124 to rotate the pivot member. The rotation of the pivot member 124 causes the rotation of the support structure 100 and the rollers 102 and gears 104 to rotate the substrate 180 degrees. In a particular embodiment, the rotational drive assembly includes a belt 130 coupled to the pivot member 124, and a motor 132 configured to drive the belt 130 to rotate the pivot member. The rotational drive assembly operates under the control of the controller (or a processor or controller associated with the inverter system 70) to rotate the substrate during an inversion process. Both assemblies rotate together as controlled by a spline shaft 152 on the motor 132, which is illustrated in FIG. 4.

Figure 6:
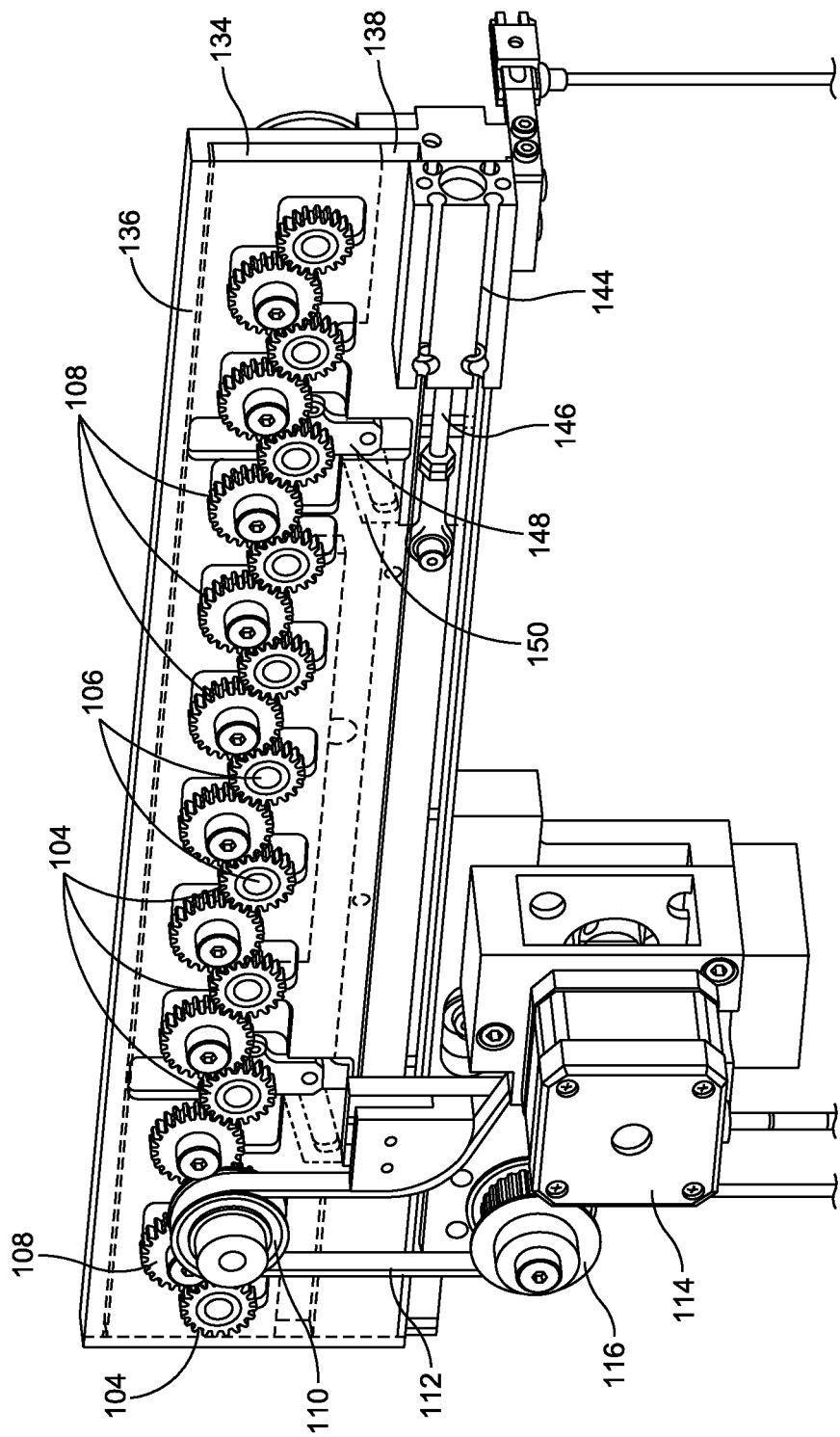
FIG. 6 is another enlarged perspective view of another portion of the external inverter system.

Referring additionally to FIG. 6, the first roller assembly 96 must be configured to grip substrates 12 having varying thicknesses. In order to achieve this objective, the support structure 100 includes a first support member 134, which is associated with the rollers 102 and the gears 104, and a second support member 136, which is associated with the belt drive assembly. As shown, the first support member 134 moves within an elongated slot 138 provided in the second support member 136 so that the first support member moves upwardly and downwardly relative to the second support member within the elongated slot. As mentioned above, each roller 102 and gear 104 combination is mounted on the shaft 106, which is secured to the first support member 134 by the bearing to enable the rotation of the roller and gear.

As shown in FIGS. 4 and 5, the roller 102 extends through a slot 140 formed in an inner wall of the second support member 136 and the gear 104 and is rigidly mounted on the first support member 134 with a bearing system. Thus, when the first support member 134 is moved upwardly and downward within the elongated slot 138 of the second support member 136, the rollers 102 and gears 104 are correspondingly moved with respect to the second support member.

A cam mechanism is provided to move the first support member 134 with respect to the second support member 136. The cam mechanism includes an air cylinder 144 mounted on the outer wall of the second support member 136. As shown in FIG. 6, the air cylinder 144 includes a power bar 146 that is coupled to a cam member 148, which rides within an associated cam 150 mounted on the first support member 134. By extending the power bar 146 with the air cylinder 144 (i.e., moving the cam member 148 away from the air cylinder by the power bar), the cam member moves the cam and the first support member 134 upwardly with respect to the second support member 136 within the elongated slot 138. This movement widens a gap between the rollers 102 (and the gears 104) and the belt drive assembly (belt 130) to accommodate substrates having wider thicknesses. Conversely, by retracting the power bar 146 with the air cylinder 144 (i.e., moving the cam member 148 towards the air cylinder by the power bar), the cam member moves the cam 150 and the first support member 134 downwardly with respect to the second support member 136 within the elongated slot 138. This movement narrows the gap between the rollers 102 (and the gears 104) and the belt drive assembly (belt 130) to clamp the substrate in position for rotation. In one embodiment, the cam mechanism is controlled by the controller or by a processor or controller associated with the inverter system 70.

Thus, the inverter system 70 of embodiments of the present disclosure is capable of accommodating a wide range of substrate thicknesses. In an open state, the gap of the inverter system 70 between the rollers 102 of the roller drive assembly and the belt 120 of the belt drive assembly is 5 mm. A center point of the pivot member 124 of the inverter system 70 may be 2.5 mm above the belt 120 of the belt drive assembly, which is centered within the first roller assembly 96 in the open position. Both the rollers 102 of the roller drive assembly and the belt 120 of the belt drive assembly are driven by the same motor and therefore operate in synchronization.

As shown in FIG. 4, the rotation of the first roller assembly 96 and the second roller assembly 98 is synchronized by way of a splined drive shaft 152 that is driven by the motor 132 to drive the rotation of the belt 130 associated with the second roller assembly. This way, the second roller assembly 98 rotates with the first roller assembly 96 when performing an inversion process.

Other permissible variations would be to have no belts in the system and to have rollers on both the top side and the bottom side of the substrate during inversion. Other permissible variations would be to have belts on both top and bottom side, but with a lesser potential component edge clearance. For example, the inverter system could include a driven assembly having a first belt assembly configured to engage one edge of the substrate and a second belt assembly configured to engage an opposite edge of the substrate, with the belt assemblies being configured to drive a linear movement of the substrate. Other permissible variations would be to alter the 5 mm space and center of rotation location to a larger or smaller range. Other permissible variations would be a device that could go to a zero thickness substrate. Other permissible variations would be to use something other than the air cylinder to accomplish the clamping force—this variation could be any other form of actuator and potentially springs to allow for compression to absorb the substrate thickness variation.

Advantages provided by the inverter system described herein include improved and enhanced speed and accuracy, potential to have heat in a dispense zone, simplicity of design, improved reliability, cost and maintainability, advantages of external inverter over existing inverter design, no loss of ability to dispense close to board edge—regardless of pump, rigidly clamped substrate—no losses due to z-axis or inverter axis movement, rigidity of inverter—no motion relative to board during rotation (misaligned axis), the complex mechanism is positioned outside of dispense zone, material removed from existing machine, and material added to create inverter outside machine.

A method of depositing material on a top surface of a substrate and on a bottom surface of the substrate is also disclosed herein. In one embodiment, the method includes delivering the substrate to the substrate support assembly of the dispenser on the first lane of the dispenser. The method further includes performing a dispense operation on the top surface of the substrate. If dispensing on the bottom surface is required, the substrate is moved to the inverter system associated with the dispenser, which rotates the substrate so that the bottom surface of the substrate faces upwardly. When rotating the substrate, the substrate is clamped by moving the roller assembly prior to rotating the substrate. The substrate is then unclamped and restored to transport height. The substrate is then moved back to the substrate support assembly, and a dispense operation is performed on the bottom surface of the substrate. When the dispense operation on the bottom surface of the substrate is completed, the substrate is removed from the substrate support assembly of the dispenser. When two lanes of the dispenser are used, another substrate is delivered to the substrate support assembly of the dispenser through the second lane. When dispensing material on the bottom surface of the second substrate is required, the inverter system is moved to the second lane so that the inverter system is in position to rotate the substrate.

Having thus described at least one embodiment of the disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The limit is defined only in the following claims and equivalents thereto.

What is claimed is:

1. A dispenser for dispensing viscous material on a substrate having a top surface and a bottom surface, the dispenser comprising:
   a frame;
   a gantry system coupled to the frame;
   a dispensing unit coupled to the gantry system, the gantry system being configured to move the dispensing unit in x-axis, y-axis, and z-axis directions;
   a substrate support assembly coupled to the frame and configured to support the substrate in a dispense position to dispense material on the top surface of the substrate and on the bottom surface of the substrate;
   a transport system coupled to the frame and configured to transport substrates into and out of the substrate support assembly; and
   an inverter system coupled to the frame and in communication with the transport system, the inverter system being positioned outside the substrate support assembly and configured to rotate a substrate orientation between a first position in which the top surface of the substrate faces upwardly and a second position in which the bottom surface of the substrate faces upwardly, the inverter system including a first driven assembly configured to engage one edge of the substrate and a second driven assembly configured to engage an opposite edge of the substrate, the first driven assembly and the second driven assembly being configured to drive a linear movement of the substrate,
   wherein the frame includes a shelf disposed on an outlet side of the transport system, the shelf being configured to support the inverter system,
   wherein the substrate support assembly includes two lanes, a front lane and a rear lane, and wherein the transport system is configured to deliver substrates to the front lane and the rear lane of the dispenser, and
   wherein the inverter system is configured to move between the front lane and the rear lane along rails.

2. The dispenser of claim 1, wherein the first driven assembly of the inverter system includes a first roller assembly and the second driven assembly of the inverter system includes a second roller assembly configured to engage an opposite edge of the substrate.

3. The dispenser of claim 2, wherein each of the first roller assembly and the second roller assembly includes a support structure, a plurality of rollers coupled to the support structure and configured to engage one of a top edge of the substrate and a bottom edge of the substrate, and a roller drive assembly coupled to the support structure and configured to drive the rotation of the rollers.

4. The dispenser of claim 3, wherein each of the first roller assembly and the second roller assembly includes a pivot assembly that is connected to the support structure of the roller assembly.

5. The dispenser of claim 3, wherein the rollers of each of the first roller assembly and the second roller assembly include a plurality of gears, each gear being associated with a respective roller.

6. The dispenser of claim 3, wherein each of the first roller assembly and the second roller assembly further includes a belt drive assembly coupled to the support structure and configured to engage the other of the top edge of the substrate and the bottom edge of the substrate.

7. The dispenser of claim 6, wherein each of the first roller assembly and the second roller assembly includes a pivot assembly that is connected to the support structure of the roller assembly.

8. The dispenser of claim 7, wherein the pivot assembly includes a pivot secured to the support structure and a rotational drive assembly to rotate the pivot, which rotates the support structure and the rollers.

9. The dispenser of claim 8, wherein the rotational drive assembly includes a belt coupled to the pivot, and a motor configured to drive the belt to rotate the pivot.

10. The dispenser of claim 6, wherein the rollers of each of the first roller assembly and the second roller assembly include a plurality of gears, each gear being associated with a respective roller.

11. The dispenser of claim 10, wherein the roller drive assembly of each of the first roller assembly and the second roller assembly is coupled to a drive gear of one of the plurality of gears.

12. The dispenser of claim 11, wherein the roller drive assembly includes a belt coupled to the drive gear, and a motor configured to drive the belt to rotate the drive gear.

13. The dispenser of claim 6, wherein the support structure includes a first support member associated with the plurality of rollers and a second support member associated with the belt drive assembly, the first support member being configured to move upwardly and downwardly relative to the second support member.

14. The dispenser of claim 13, wherein each of the first roller assembly and the second roller assembly further includes a cam mechanism configured to move the first support member with respect to the second support member.

15. A method of depositing material on a top surface of a substrate and on a bottom surface of the substrate, the method comprising:
- delivering the substrate to a substrate support assembly of a dispenser through a first lane;
- performing a dispense operation on the top surface of the substrate;
- moving the substrate to an inverter system associated with the dispenser;
- rotating the substrate so that the bottom surface of the substrate faces upwardly;
- moving the substrate back to the substrate support assembly;
- performing a dispense operation on the bottom surface of the substrate;
- removing the substrate from the substrate support assembly of the dispenser;
- delivering another substrate to the substrate support assembly of the dispenser through a second lane; and
- moving an inverter system configured to rotate the substrate between the first lane and the second lane to rotate the substrates for reinsertion in either lane.

16. The method of claim 15, further comprising clamping the substrate with a roller assembly prior to rotating the substrate.

* * * * *